(12) United States Patent
Zhao (10) Patent No.: US 10,354,837 B2
(45) Date of Patent: Jul. 16, 2019

(54) CONTROLLING ETCH RATE DRIFT AND PARTICLES DURING PLASMA PROCESSING

(71) Applicant: Tokyo Electron Limited, Tokyo (JP)

(72) Inventor: Jianping Zhao, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/869,649

(22) Filed: Jan. 12, 2018

(65) Prior Publication Data

US 2018/0138016 A1    May 17, 2018

Related U.S. Application Data

(62) Division of application No. 14/533,931, filed on Nov. 5, 2014, now abandoned.

(60) Provisional application No. 61/900,112, filed on Nov. 5, 2013.

(51) Int. Cl.
*H01J 37/32* (2006.01)
*C23C 14/08* (2006.01)
*C23C 4/134* (2016.01)
*H01L 21/3065* (2006.01)

(52) U.S. Cl.
CPC ........ *H01J 37/32082* (2013.01); *C23C 4/134* (2016.01); *C23C 14/08* (2013.01); *H01J 37/32192* (2013.01); *H01J 37/32467* (2013.01); *H01J 37/32477* (2013.01); *H01J 37/32495* (2013.01); *H01J 37/32559* (2013.01); *H01L 21/3065* (2013.01)

(58) Field of Classification Search
None
See application file for complete search history.

(56) References Cited

U.S. PATENT DOCUMENTS

| | | | |
|---|---|---|---|
| 6,783,875 B2 | 8/2004 | Yamada et al. | |
| 6,852,433 B2 | 2/2005 | Maeda | |
| 2004/0002221 A1* | 1/2004 | O'Donnell | C23C 16/4404 438/710 |
| 2009/0214825 A1 | 8/2009 | Sun et al. | |
| 2010/0129670 A1 | 5/2010 | Sun et al. | |
| 2013/0115418 A1 | 5/2013 | Young-Dohe et al. | |
| 2013/0162142 A1* | 6/2013 | Nishino | H05H 1/46 315/111.21 |
| 2014/0057078 A1 | 2/2014 | Hamaya et al. | |

* cited by examiner

*Primary Examiner* — Jiong-Ping Lu
(74) *Attorney, Agent, or Firm* — Wood Herron & Evans LLP (57) ABSTRACT

The invention is an plasma processing system with a plasma chamber for processing semiconductor substrates, comprising: a radio frequency or microwave power generator coupled to the plasma chamber; a low pressure vacuum system coupled to the plasma chamber; and at least one chamber surface that is configured to be exposed to a plasma, the chamber surface comprising: a $Y_xO_yF_z$ layer that comprises Y in a range from 20 to 40%, O in a range from greater than zero to less than or equal to 60%, and F in a range of greater than zero to less than or equal to 75%. Alternatively, the $Y_xO_yF_z$ layer can comprise Y in a range from 25 to 40%, O in a range from 40 to 55%, and F in a range of 5 to 35% or Y in a range from 25 to 40%, O in a range from 5 to 40%, and F in a range of 20 to 70%.

16 Claims, 9 Drawing Sheets

CONTROLLING ETCH RATE DRIFT AND PARTICLES DURING PLASMA PROCESSING

CROSS REFERENCE TO RELATED APPLICATIONS

The present application is a divisional of U.S. patent application Ser. No. 14/533,931, filed on Nov. 5, 2014, which claims the benefit of U.S. Provisional Patent Application No. 61/900,112, filed on Nov. 5, 2013, entitled "Systems and Methods for Controlling Etch Rate Drift and Particles During Plasma Processing", which are incorporated herein by reference in their entireties.

BACKGROUND OF THE INVENTION

Field of Invention

This disclosure is related to methods and systems for processing a substrate and more specifically to methods and systems for controlling etch rate drift and creation of particles during plasma processing.

Description of Related Art

Chamber wall materials/coatings are critical in high density plasma process with heavily reactive and corrosive feed gas. Very often, the plasma process is very sensitive to the surface changes of chamber wall materials/coatings with time (or radio frequency (RF) time). Some chamber wall materials/coatings, (e.g. Yttrium based materials or coatings), can run extended RF hours, (for example, greater than thousand RF hours) compared to others, (e.g. anodized Al), which may only run a couple of hundred RF hours. Also, some chamber wall materials/coatings can more easily generate particles compared to other materials/coatings. Furthermore, the surface change of the chamber wall materials/coatings may even change the RF current return or affect the plasma species like radical concentrations, plasma density, or other plasma parameters, which then cause significant process drift, (e.g. etch rate drift), or chamber matching.

So far, yttrium based coatings, mainly $Y_2O_3$ coatings have been widely used in plasma process tools as a chamber coating material due to its high resistance to erosion and corrosion, especially in metal or gate etch processes which involve heavily $Cl_2/O_2$ or $HBr/O_2$ plasmas. However, in some processes, particles originated from $Y_2O_3$ coatings have been recognized to be a big issue especially as the lines or features become smaller and smaller. These particles may cause device and process failure. Also, wafer-less dry clean or wet clean are not the solution to eliminate the particle generation during the plasma process. Alternatively, $YF_3$ coating instead of $Y_2O_3$ coatings has been used to suppress the particle generation. However, while it has successfully suppressed the particle generation, other issues appeared. It has been found that the etch rate drifted or decreased significantly with fresh or cleaned chamber walls and it requires extended dummy runs to season the chamber walls in order to have an acceptable and stable etch rate. There are no clear solutions on the $Y_2O_3$ particle issue and $YF_3$ etch rate drift issue so far due to lack of understanding of the mechanisms of the particle formation and etch rate drift.

There is a need for an understanding of the mechanism and pathways that cause the particle formation and etch rate drift issues. With this understanding, a system and method for controlling creation of particles and etch rate drift during plasma processing can be developed and implemented.

SUMMARY OF THE INVENTION

The invention is an plasma processing system with a plasma chamber for processing semiconductor substrates, comprising: a radio frequency or microwave power source coupled to the plasma chamber; a low pressure vacuum system coupled to the plasma chamber; and at least one chamber surface that is configured to be exposed to a plasma, the chamber surface comprising: a $Y_xO_yF_z$ layer that comprises Y in a range from 20 to 40%, O in a range of greater than zero to less than or equal to 60% and F in a range of greater than zero to less than or equal to 75%.

The invention also includes a method for plasma etching semiconductor substrates comprising: positioning a substrate within a plasma processing chamber comprising a surface of $Y_2O_3$; flowing process gases comprising HBr and $O_2$; flowing a scavenger gas with the process gas, the scavenger gas comprising $CF_w$. The scavenger gas reacts with H in the plasma to minimize reactions between the H and the $Y_2O_3$. The method further comprises controlling a composition of the $Y_xO_yF_z$ layer to achieve a target yttrium hydroxide particle generation in the plasma processing chamber and a target etch rate of the substrate.

BRIEF DESCRIPTION OF THE DRAWINGS

FIG. 2A depicts an exemplary graph of the ratio of the optical emission spectrum (OES) signal intensity of hydrogen compared to argon as a function of time while

FIG. 3A depicts an exemplary graph of the ratio of the OES signal intensity of oxygen compared to argon as a function of time where the O/Ar ratio is from 0.45 to 0.70 while

DETAILED DESCRIPTION

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "radiation sensitive material" means and includes photosensitive materials such as photoresists.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

Figure 1A:
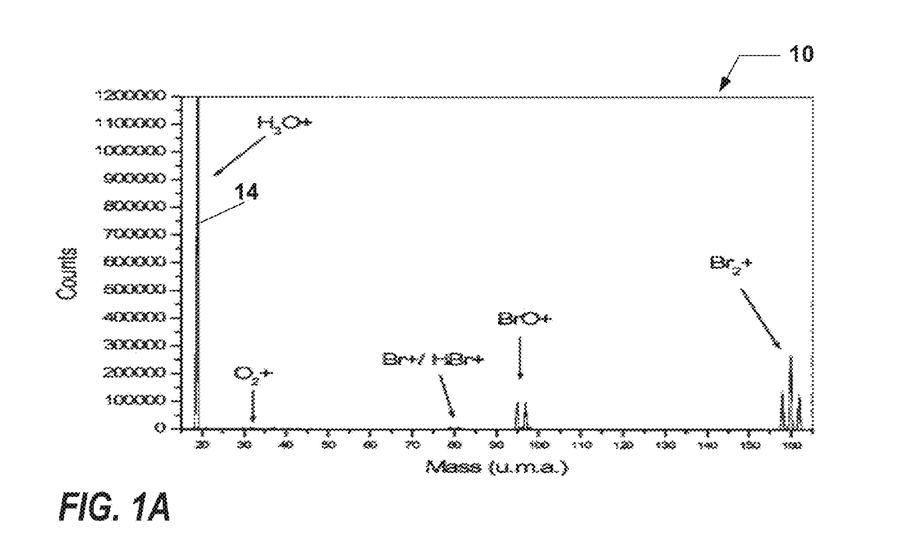
FIG. 1A depicts an exemplary graph of mass spectrum data of $HBr/O_2$ using a reference silicon substrate.
Figure 1B:
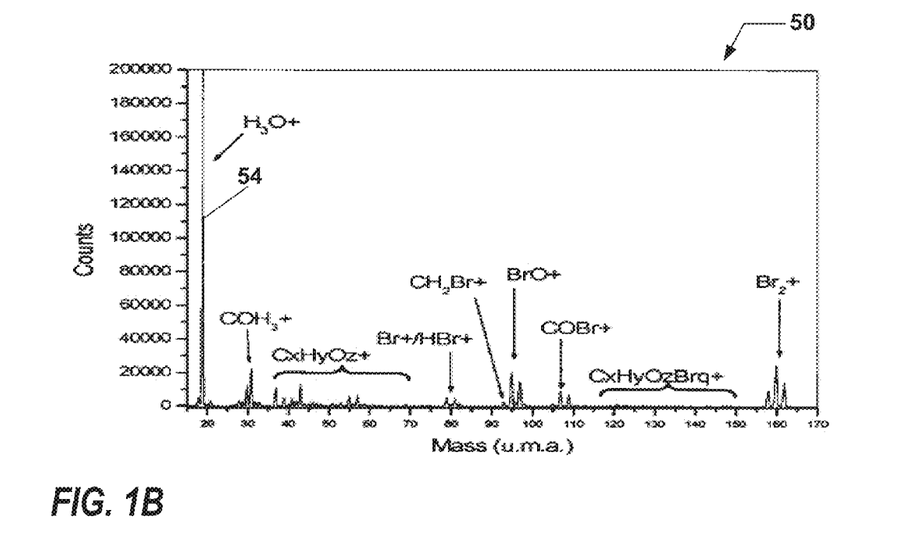
FIG. 1B depicts an exemplary graph of mass spectrum data of $HBr/O_2$ using a silicon substrate with photoresist.

FIG. 1A depicts an exemplary graph 10 of mass spectrum data using a reference silicon substrate exposed to a $HBr/O_2$ process gas. The reference silicon substrate can be a bare silicon substrate or silicon dioxide substrate, and the process gas can be a combination of HBr and oxygen. Graph 10 shows the number of counts of $H_2O$ related molecules versus the atomic mass units (uma) as measured by a mass spectrometer. The measurement 14 for the reference silicon substrate is indicated by peak $H_3O+$ and exceeds 1,200,000 counts. FIG. 1B depicts an exemplary graph 50 of mass spectrum data of $HBr/O_2$ plasma using a silicon substrate with photoresist. The measurement 54 for the silicon substrate with resist is indicated by peak $H_3O+$ and exceeds 200,000 counts. The traditional $Y_2O_3$ coating in processing chambers is usually very stable to ambient conditions and it has very high melting temperature up to 268 degrees C. However, under $HBr/O_2$ high density plasma condition, OH molecule or H and O atoms are generated. These species can react with $Y_2O_3$ to form $Y(OH)_3$:

$Y_2O_3+3H_2O=2Y(OH)_3$.

This yttrium hydroxide is very brittle and can form particles from the $Y_2O_3$ coating surface.

Figure 2A:
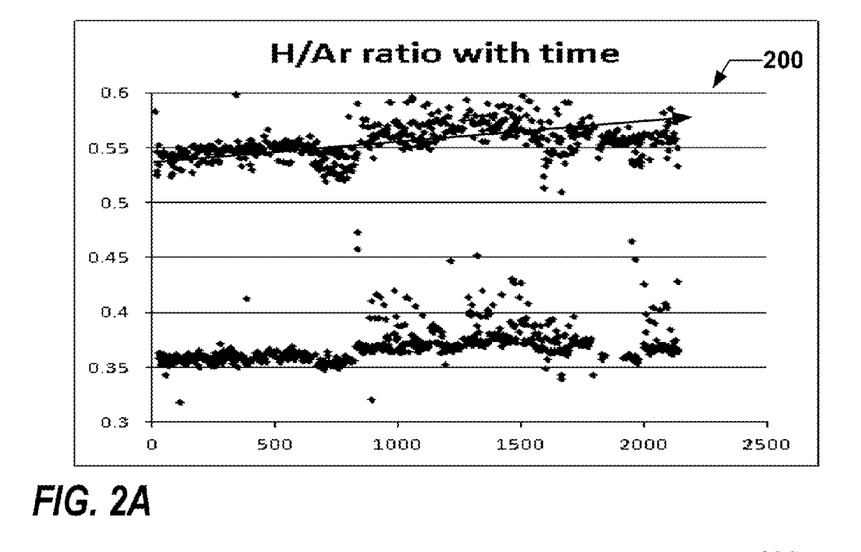
Figure 2B:
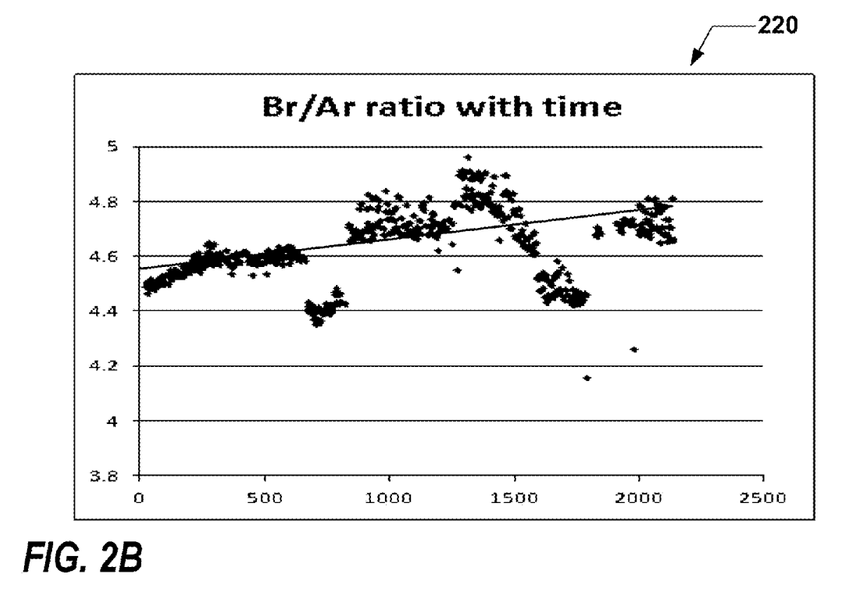
FIG. 2B depicts an exemplary graph of the ratio of the OES signal intensity of bromine compared to argon as a function of time.

FIG. 2A depicts an exemplary graph 200 of the ratio of the OES signal intensity of hydrogen compared to argon as a function of time where the H/Ar ratio is from 0.30 to 0.60 while FIG. 2B depicts an exemplary graph 220 of the ratio of the OES signal intensity of bromine compared to argon as a function of time where the Br/Ar ratio is from 3.8 to 5.0, both using a process chamber where a surface is treated with $YF_3$.

Figure 3A:
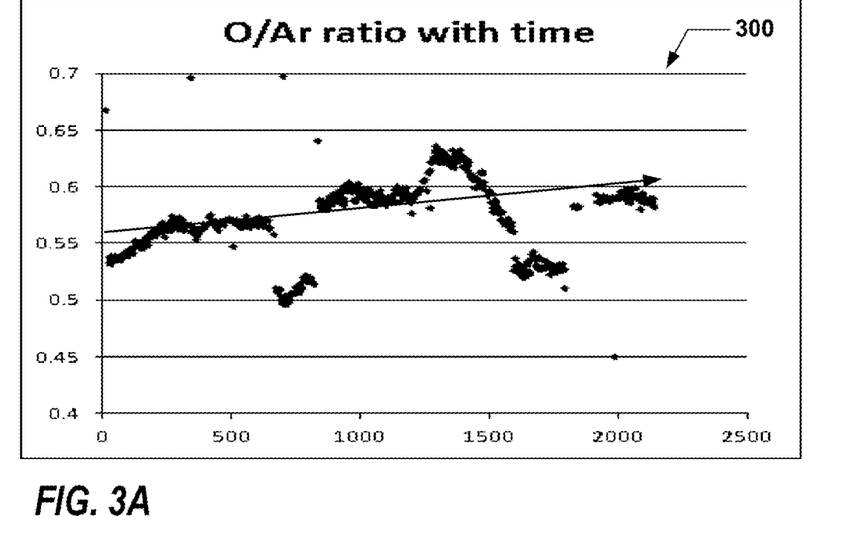
Figure 3B:
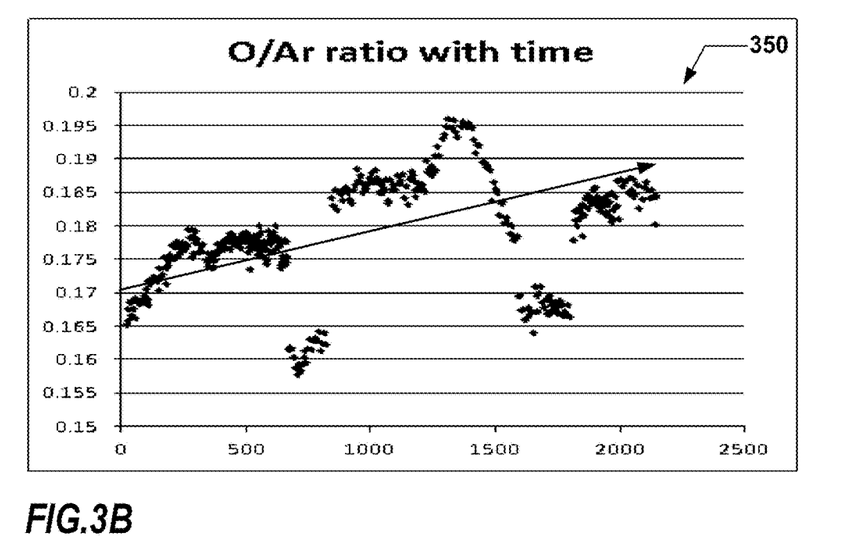
FIG. 3B depicts an exemplary graph of the ratio of the OES signal intensity of oxygen compared to argon as a function of time where the O/Ar ratio is from 0.155 to 0.200.

FIG. 3A depicts an exemplary graph 300 of the ratio of the OES signal intensity of oxygen compared to argon as a function of time where the O/Ar ratio is from 0.45 to 0.70 while FIG. 3B depicts an exemplary graph 350 of the ratio of the OES signal intensity of oxygen compared to argon as a function of time where the O/Ar ratio is from 0.155 to 0.200, both also using a process chamber where a surface is treated with $YF_3$. The increase in the ratios shows that surface recombination rate change of the radicals on the $YF_3$ layer causes an etch rate drift during the plasma processing. It also indicates that $YF_3$ coating layer undergoes a surface composition change during plasma process (surface modification by plasma species reaction with wall).

Figure 4:
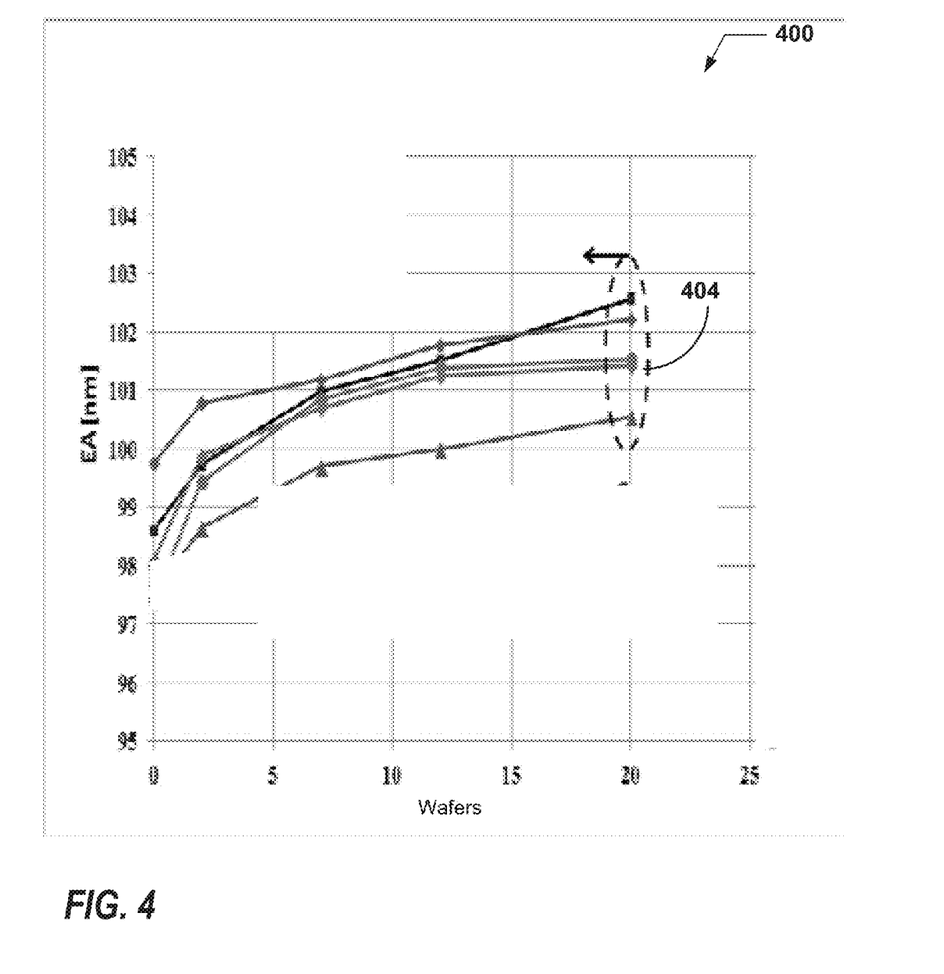
FIG. 4 depicts the average etch rate (EA) in nanometers for groups of $YF_3$ based chamber wall coatings showing significant etch rate drift.

FIG. 4 depicts a graph 400 of the average etch rates (EA) in nanometers for a group of $YF_3$ based chamber wall coatings showing significant etch rate drift. The group of coatings included in dotted line circle 404 showed significant improvement in average etch rate as the number of substrate used for "seasoning" the plasma processing system increases. Seasoning is a process of processing a blank or bare silicon substrate in an etch or other fabrication process in order to establish a set of stable conditions and achieve the objective of the process. In this case, the objective of the seasoning is to reduce the size and the number of $Y(OH)_3$ particles generated and increase the etch rate to a rate that is within the process expectation.

Figure 5:
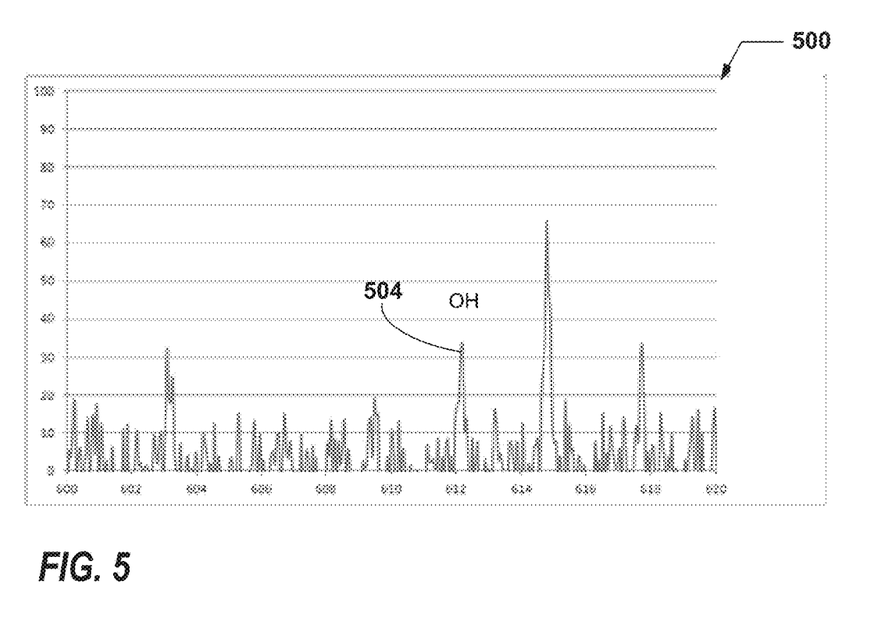
FIG. 5 depict the formation of OH molecules in a plasma chamber coated with $Y_2O_3$ monitored by OES, which is attributed to cause the yttrium hydroxide particles formation.

FIG. 5 depicts a graph illustrating the significance of Oil peak formation 504 in an $Ar/HBr/O_2$ plasma OES, which is an indication of yttrium hydroxide particles generation.

Figure 6A:
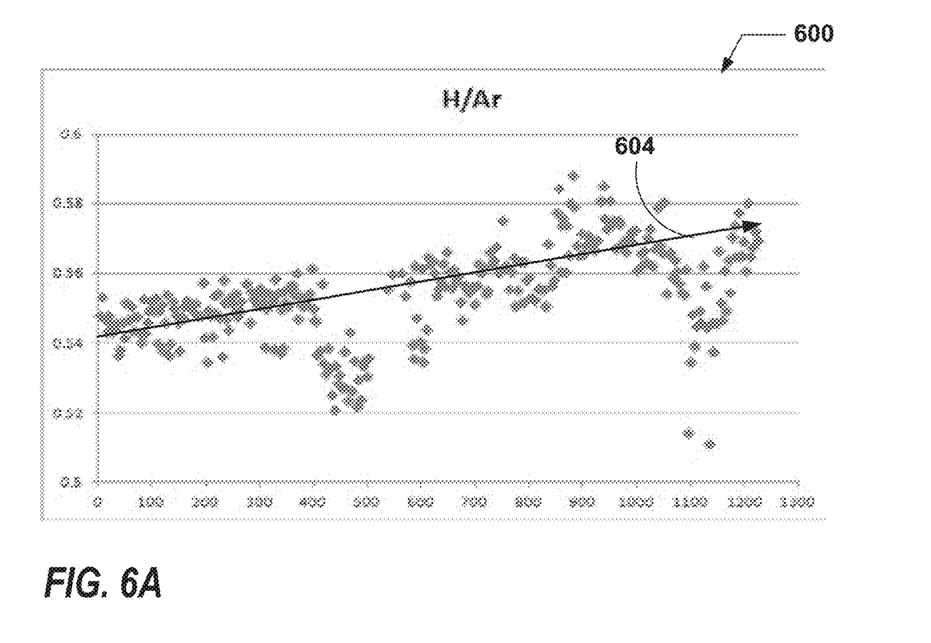
FIGS. 6A, 6B, and 6C depict the mechanism of the average etch rate (EA) drift associated with the $YF_3$ coating when hydrogen, bromine, and oxygen are presented in the gas composition as a function of time.
Figure 6B:
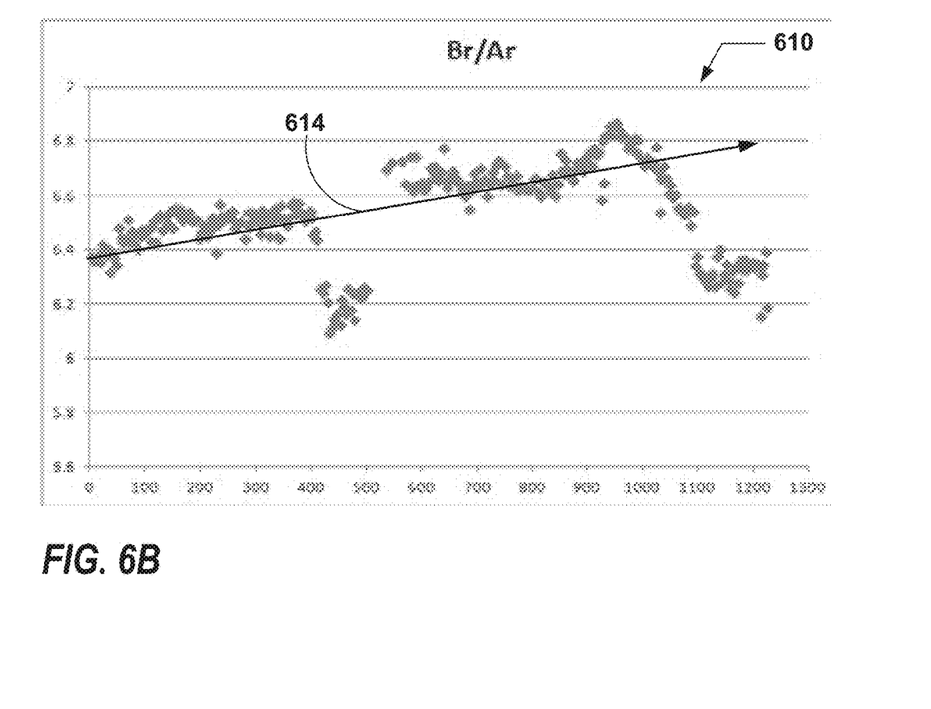
Figure 6C:
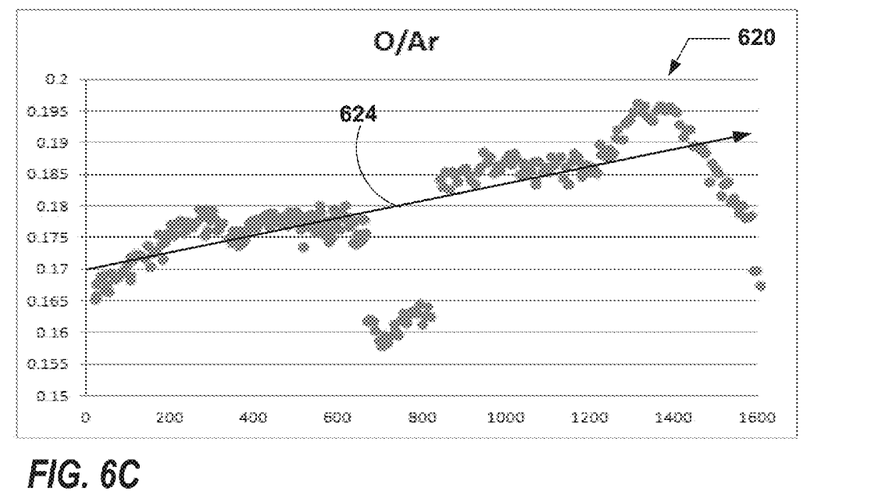

FIGS. 6A, 6B, and 6C depict with graph 600, 610, and 620 the mechanism of the radical drift during seasoning with blank substrate with hydrogen, bromine, and oxygen in the plasma gas composition respectively and where the radical drift is presented as a function of time. Graph 600 depicts a trend line 604 from data points of the hydrogen to argon intensity ratios as a function of time. Trend line 604 indicates that the hydrogen to argon intensity ratios rise as time passes and as more blank substrates are passed through the etching system. Similarly, graph 610 of FIG. 6B depicts a trend line 614 from data points of the bromine to argon intensity ratios as a function of time. Trend line 614 indicates that the bromine to argon intensity ratios rise as time passes and as more blank substrates are passed through the etching system. Similarly, graph 620 of FIG. 6C depicts a trend line 624 from data points of the oxygen to argon intensity ratios as a function of time. Trend line 624 indicates that the oxygen to argon intensity ratios rise as time passes and as more blank substrates are passed through the etching system.

Figure 7:
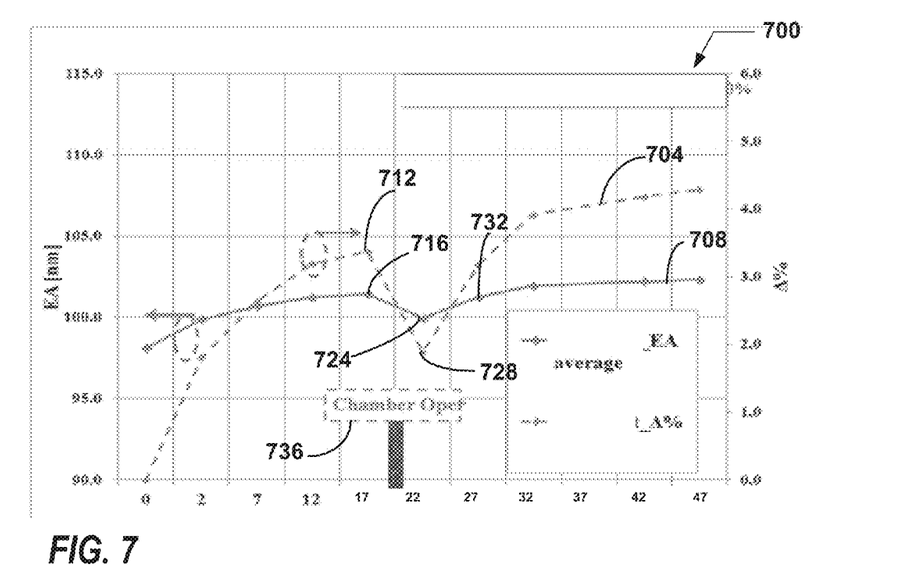
FIG. 7 depicts the average etch rate (EA) changes during wafer process and after chamber cleaning.

FIG. 7 depicts a graph 700 of the average etch rate (EA) as a function of time. The solid line graph 708 shows the EA in nanometers per unit of time on the Y-axis on the left. Graph 708 starts at time 0 with 98 nm of EA and proceeds upward until time 17, point 716, where the etch rate goes down due to opening of the chamber for cleaning, designated by time slot 736. Graph 708 reaches a lower etch rate at time 22, 100 nm of EA, point 724 where the etch rate starts going up toward point 732 and then leveling off. Similarly, the dotted line graph 704 shows the change of etch rate as a percentage referenced to time 0 on the Y-axis on the right. Graph 704 starts at about 0% Δ at time 0, proceeds with a steep up-slope until time 17, point 712, where the % Δ goes down abruptly in response to opening of the chamber, designated by time slot 736. Graph 704 reaches a lower etch rate at time 22, at 2% Δ, point 728 where the % Δ starts going up and leveling off at about 4.3% Δ. In summary, FIG. 7 illustrates how the etch rate is affected by the chamber environment.

Figure 8:
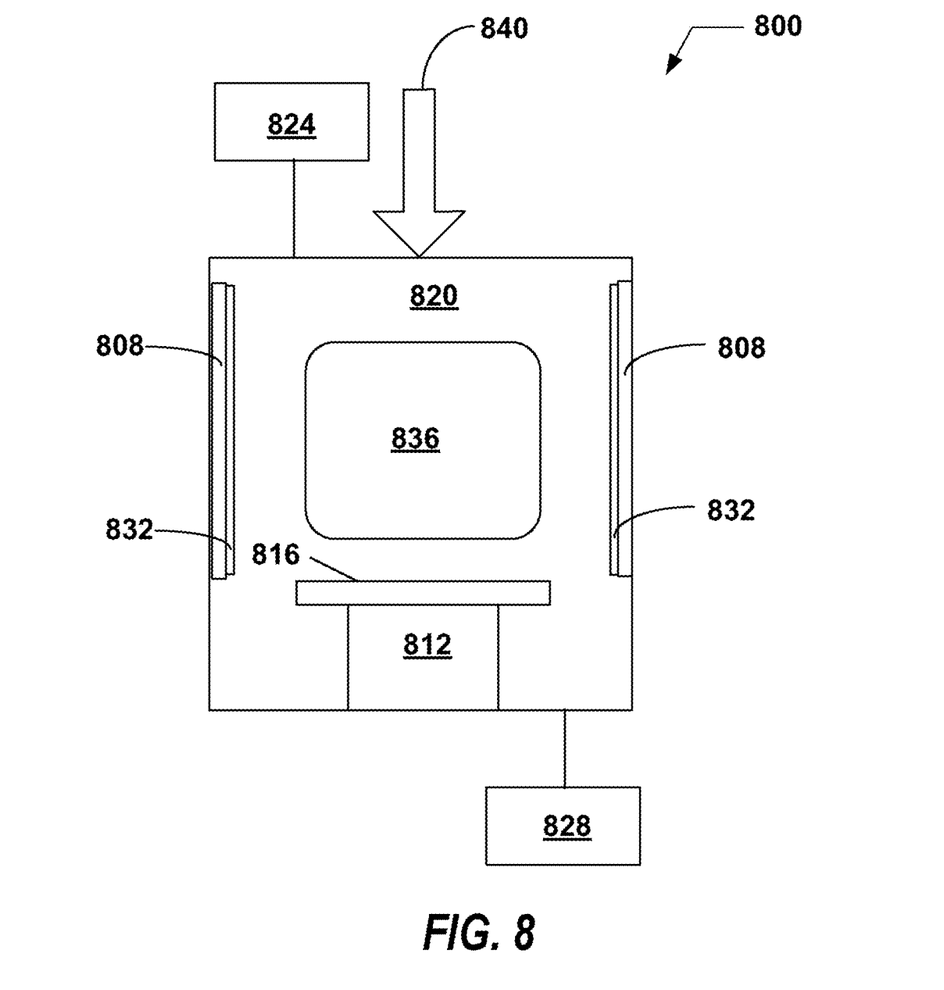
FIG. 8 depicts a plasma processing chamber for etching a substrate with at least one chamber surface including a $Y_xO_yF_z$ layer.

FIG. 8 depicts an plasma processing system 800 comprising a plasma processing chamber 820 for etching a substrate 816 with at least one chamber surface 808 including a $Y_xO_yF_z$ layer 832. The substrate 816 is disposed on a chuck 812 inside the plasma processing system 800. Coupled to the plasma processing chamber 820 are a radio frequency (RF) or microwave power source 824 and a low pressure vacuum system 828. The RF or microwave power source 824 provides power to create a plasma 836 inside the plasma processing chamber 820. Process fluid treatment 840 is introduced into the plasma processing chamber 820 to create the plasma 836. Process fluid treatment 840 may include oxygen containing gases such as $O_2$, CO, $CO_2$, $H_2O$ or $H_2O_2$ or F-containing gas such as $CF_4$, $C_4F_8$, $C_5F_8$, $F_2$, or $SF_6$. Other process gases may include HBr, $H_2$, $Cl_2$ and others.

Figure 9:
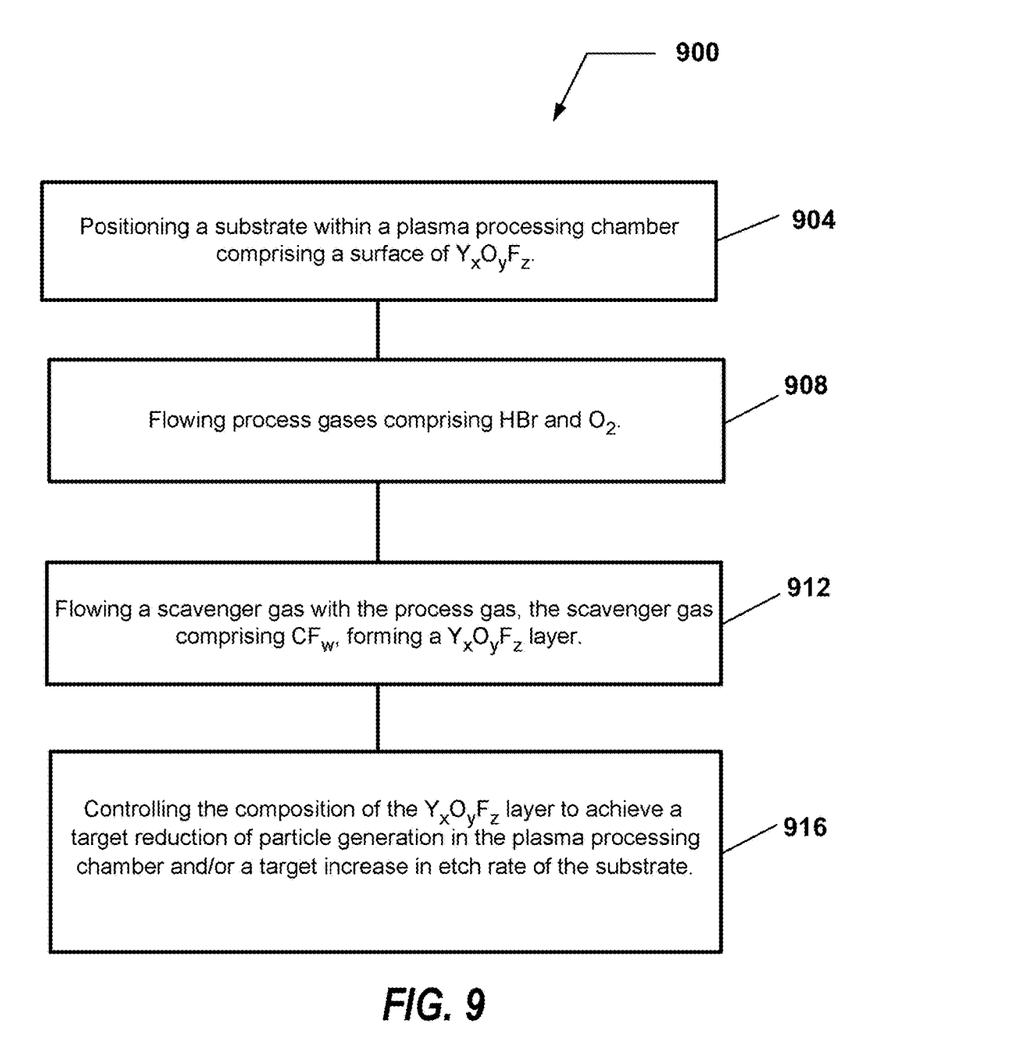
FIG. 9 is a flowchart illustrating a method of etching a substrate using a processing chamber with at least one chamber surface including an $Y_xO_yF_z$ layer in an embodiment of the present invention.

FIG. 9 is a flowchart 900 illustrating a method of processing a substrate using a processing chamber with at least one chamber surface including a $Y_xO_yF_z$ layer in an embodiment of the present invention. In operation 904, a substrate is positioned on top of a chuck within a plasma processing chamber, the plasma processing chamber having at least one chamber surface exposed to a plasma, the at least one chamber surface comprising a $Y_xO_yF_z$ layer. In operation 908, process gases are flowed into the processing chamber, the process gases, for example, comprising HBr and $O_2$. In operation 912, which is used only when $Y_2O_3$ chamber coating is presented and particle formation is the main concern, a scavenger gas is flowed with the process gas. The scavenger gas comprises $CF_w$ (fluorocarbon), which can reduce OH or H concentration in plasma. Therefore, H reaction on the $Y_2O_3$ coating to form $Y(OH)_3$ can be suppressed. In operation 916, the composition of the $Y_xO_yF_z$ layer is controlled to achieve a target reduction of particle generation in the plasma processing chamber and/or a target increase in etch rate of the substrate. The target reduction of the particle generation can be set at 50% or greater. The target increase in etch rate can be set at a range of 2 to 50% or a range of 15 to 30%.

Some material processing approaches and techniques explain or alleviate the problems described above. The $Y_2O_3$ coating can be made dense by reducing the particle size or grain size during plasma spray, getting close to nanometer-sized $Y_2O_3$ particles. Spray particle size can be 1 μm or less when applied to the $Y_2O_3$. Polished or glass ball blasting can be used to further smooth and increase the density of the coating surface to prevent $H_2O$ uptake. Surface roughness (Ra) of the $Y_2O_3$ layer may be less than 1.6 μm. Pre-coat the $Y_2O_3$ surface using $SiCl_4$ or $CF_w$ (fluorocarbon) gases to reset the surface or fill the porous portions of the $Y_2O_3$ layer. The surface roughness (Ra) may be less than 1.6 μm.

Adding a small amount of $CF_w$ (fluorocarbon) into plasma gas recipe, e.g., F or C species in $HBr/O_2/CF_w$ plasma, will scavenge the H in the plasma to prevent H reaction on the $Y_2O_3$ coating to form $Y(OH)_3$. A surface layer of $Y_xO_yF_z$ forms on the $Y_2O_3$ coating using a plasma treatment in $CF_w$ or F containing gas. An alternate furnace thermal treatment in F containing ambient, or wet chemical treatment in HF may be performed.

In one embodiment, plasma-spray a layer of $YF_3$ onto the $Y_2O_3$ coating to form a multilayer coating. The $Y_xO_yF_z$ layer thickness may be less than 10% of the $Y_2O_3$ layer thickness. Alternatively, plasma-spray a layer of $YF_3$ onto the $Y_2O_3$ coating followed by thermal annealing to form a mixture coating. The $YF_3$ layer thickness may be less than 10% of the $Y_2O_3$ layer thickness. In yet another embodiment, simultaneous plasma-spray $YF_3$ and $Y_2O_3$ on to a chamber wall parts such that the O composition is less than 60%.

$YF_3$ has a much lower melting temperature, about 1387 degrees C., which enables the plasma-spray $YF_3$ coatings to have a dense and smooth surface. The $YF_3$ coating is also inert to OH attack so no $Y(OH)_3$ compound would form. These are the main reasons that $YF_3$ has less particle generation issues during the plasma process. However, compared to the $Y_2O_3$ surface, surface recombination rate of Br, F, Cl and H active species will be much higher on the $YF_3$ surface. The chemisorbed species listed above are not strongly bonded compared to Y—F bond. This bonding situation facilitates the subsequent physisorbed species to recombine with the chemisorbed species to form HBr, $Br_2$, $Cl_2$, $F_2$, etc. These molecular species will then desorb from the surface of the coating(s), which causes radical quenching and reduces the etch rate due to reactants reduction. Furthermore, with continued seasoning and dummy run or a continuous process run, the $YF_3$ coating can be "oxidized" by O radicals, forming a layer of $Y_xO_yF_z$ on the $YF_3$ coating. This new layer will gradually reduce the surface recombination rate of reactive species so less radical quenching occurs. As a consequence, the etch rate will gradually increase until the layer of $Y_xO_yF_z$ become stable in chemical composition and the recombination rate become small and stable.

The inventor found out that a solid understanding of the mechanisms of the particle generation with $Y_2O_3$ layers and the etch rate drift using $YF_3$ layers are needed to resolve these particle generation and the etch rate drift problems. The layer must include the components Y, O, and F in certain ranges. For example, a $Y_xO_yF_z$ layer that comprises Y in a range from 20 to 40%, O in a range greater than zero to less than or equal to 60%, and F in a range of greater than zero to less than or equal to 75%. In another embodiment, the $Y_xO_yF_z$ layer can comprise Y in a range from 25 to 40%, O in a range from 40 to 55%, and F in a range of 5 to 35%. In yet another embodiment, the $Y_xO_yF_z$ layer that comprises Y in a range from 25 to 40%, O in a range from 5 to 40%, and F in a range of 20 to 70%.

In still another embodiment, the $Y_xO_yF_z$ layer or a $YF_3/Y_2O_3$ mixture layer or multilayer is formed by spraying particles of $YF_3$ and $Y_2O_3$ with a ratio in a range of 0.1:1 to 10:1. The $Y_xO_yF_z$ layer or a mixture layer can be a layer formed on the at least one chamber surface or a liner placed in the plasma chamber.

Several material engineering techniques and approaches were found to assist in solving the particle generation and etch rate drift problems. One alternative is to form a surface layer of $Y_xO_yF_z$ on the $YF_3$ coating using a plasma treatment using an $O_2$ containing plasma and/or furnace thermal treatment in $O_2$ containing ambient. Another alternative is to perform a plasma spray of a layer of $Y_2O_3$ onto the $YF_3$ coating to form a multi-layer coating. In yet another alternative, the plasma spray can be a layer of $Y_2O_3$ onto the $YF_3$ coating followed by thermal annealing to form a mixture coating. Another alternative is to prepare the $Y_2O_3$ and $YF_3$ in a form that can be sprayed or that is in powder form and co-spray the $YF_3$ and $Y_2O_3$, varying the ratio of $YF_3$ and $Y_2O_3$ in a range from 0.1:1 to 10:1. Another alternative is to spray powder composed of $Y_xO_yF_z$ to the chamber wall parts.

Furthermore, there are processes that will improve the properties of the $Y_xO_yF_z$ layer. First, the surface of the $Y_xO_yF_z$ layer can be pre-coated with $SiCl_4$ or $CF_w$ (fluorocarbon) to reset the surface or fill the porous components of the $Y_xO_yF_z$ layer. Second, to reduce the surface recombination of the radical, for example, O or F, make the coating dense by using spray particles to reduce the surface area of the $Y_xO_yF_z$ layer. Third, the spray particle size of the F-containing spray can be 1 µm or less when applied to the $Y_2O_3$. Fourth, polished or glass balls can be blasted to make the $Y_xO_yF_z$ layer smooth and dense in order to reduce the surface recombination. Fifth, the $Y_xO_yF_z$ layer can be heated up to reduce the surface recombination rate of the radicals.

In this invention, x, y, z or w in $Y_xO_yF_z$ or in $CF_w$ represents the atomic composition percentage in the compounds or molecules.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method for plasma etching semiconductor substrates comprising:
    positioning a substrate within a plasma processing chamber comprising a surface of $Y_2O_3$;
    flowing a process gas comprising HBr and $O_2$ into the plasma processing chamber and forming a plasma therefrom to etch the substrate;
    flowing a scavenger gas comprising $CF_w$ with the process gas, wherein the scavenger gas reacts with H in the plasma to minimize reactions between the H and the $Y_2O_3$ and causes a $Y_xO_yF_z$ layer to form on the surface of $Y_2O_3$; and
    controlling a composition of the $Y_xO_yF_z$ layer to achieve a target yttrium hydroxide particle generation in the plasma processing chamber and a target etch rate of the substrate.

2. The method of claim 1, further comprising spraying a layer of $YF_3$ onto the surface of $Y_2O_3$ to form a multilayer coating.

3. A method for plasma etching semiconductor substrates comprising:
    positioning a substrate within a plasma processing chamber comprising a surface of $Y_2O_3$ or $YF_3$;
    flowing a process gas comprising HBr and $O_2$ into the plasma processing chamber and forming a plasma therefrom to etch the substrate;
    flowing a scavenger gas with the process gas, the scavenger gas comprising a fluorine-containing gas or an oxygen-containing gas;
    forming a $Y_xO_yF_z$ layer on the surface of $Y_2O_3$ or $YF_3$; and
    controlling a composition of the $Y_xO_yF_z$ layer to achieve a target yttrium hydroxide particle generation in the plasma processing chamber and a target etch rate of the substrate.

4. The method of claim 3, wherein the surface is of $Y_2O_3$ and the fluorine-containing gas includes HF, $CF_4$, $C_4F_8$, $C_5F_8$, $F_2$, or $SF_6$.

5. The method of claim 3, wherein the surface is of $Y_2O_3$ and the fluorine-containing gas includes $CF_w$ or F.

6. The method of claim 3, wherein the surface is of $YF_3$ and the oxygen-containing gas includes $O_2$, CO, $CO_2$, $H_2O$, or $H_2O_2$.

7. A method for plasma etching semiconductor substrates comprising:
    positioning a substrate within a plasma processing chamber comprising a $Y_xO_yF_z$ surface layer;
    flowing a process gas comprising HBr and $O_2$ into the plasma processing chamber and forming a plasma therefrom to etch the substrate; and
    controlling a composition of the $Y_xO_yF_z$ surface layer to achieve a target yttrium hydroxide particle generation in the plasma processing chamber and a target etch rate of the substrate.

8. The plasma chamber of claim 7, further comprising forming the $Y_xO_yF_z$ surface layer by exposing an initial layer of $Y_2O_3$ to a fluorine-containing treatment.

9. The plasma chamber of claim 8, wherein the fluorine-containing treatment includes HF, $CF_4$, $C_4F_8$, $C_5F_8$, $F_2$, or $SF_6$.

10. The plasma chamber of claim 8, wherein the fluorine-containing treatment is a wet chemical treatment using HF or a plasma treatment using $CF_w$ or F.

11. The plasma chamber of claim 7, further comprising forming the $Y_xO_yF_z$ surface layer by exposing an initial layer of $YF_3$ to an oxygen-containing treatment.

12. The plasma chamber of claim 11, wherein the oxygen-containing treatment includes $O_2$, CO, $CO_2$, $H_2O$, or $H_2O_2$.

13. The plasma chamber of claim 7, further comprising forming the $Y_xO_yF_z$ surface layer with a $Y_xO_yF_z$ compound in powder form.

14. The plasma chamber of claim 7, further comprising forming the $Y_xO_yF_z$ surface layer with a co-spray of $Y_2O_3$ in powder form and $YF_3$ in powder form.

15. The plasma chamber of claim 7, wherein the $Y_xO_yF_z$ surface layer is a layer or a multi-layer, the method further comprising forming the $Y_xO_yF_z$ surface layer by a plasma spray or a thermal spray comprising $YF_3$ on top of a $Y_2O_3$ layer followed by thermal annealing.

16. The plasma chamber of claim 7, wherein the $Y_xO_yF_z$ surface layer is a layer or a multi-layer, the method further comprising forming the $Y_xO_yF_z$ surface layer by a plasma spray or a thermal spray comprising $Y_2O_3$ on top of a $YF_3$ layer followed by thermal annealing.

* * * * *

UNITED STATES PATENT AND TRADEMARK OFFICE
CERTIFICATE OF CORRECTION

PATENT NO. : 10,354,837 B2
APPLICATION NO. : 15/869649
DATED : July 16, 2019
INVENTOR(S) : Jianping Zhao It is certified that error appears in the above-identified patent and that said Letters Patent is hereby corrected as shown below:

On the Title Page

Column 2, Abstract Line 1, change "The invention is an plasma processing system with a plasma" to –The invention is a plasma processing system with a plasma–.

In the Specification

Column 1, Lines 66-67, change "The invention is an plasma processing system with a plasma chamber for" to –The invention is a plasma processing system with a plasma chamber for–.

Column 2, Line 42, change "FIG. 5 depict the formation of OH" to –FIG. 5 depicts the formation of OH–.

Column 2, Line 52, change "FIG, 8 depicts a plasma processing" to –FIG. 8 depicts a plasma processing–.

Column 4, Lines 35-36, change "FIG. 5 depicts a graph illustrating the significance of Oil peak formation" to –FIG. 5 depicts a graph illustrating the significance of OH peak formation–.

Column 5, Line 10, change "FIG. 8 depicts an plasma processing" to –FIG. 8 depicts a plasma processing–.

Signed and Sealed this
Tenth Day of September, 2019

Andrei Iancu
*Director of the United States Patent and Trademark Office*